United States Patent
Bowman et al.

(10) Patent No.: US 6,861,205 B2
(45) Date of Patent: Mar. 1, 2005

(54) THREE DIMENSIONAL MICROSTRUCTURES AND METHOD OF MAKING

(75) Inventors: Lawrence E. Bowman, Richland, WA (US); Glen C. Dunham, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 10/072,360

(22) Filed: Feb. 6, 2002

(65) Prior Publication Data

US 2003/0148222 A1 Aug. 7, 2003

(51) Int. Cl.$^7$ ................................................. G03F 7/00
(52) U.S. Cl. ....................... 430/312; 430/311; 430/313; 430/315; 430/322; 430/324
(58) Field of Search ................................. 430/311, 312, 430/313, 315, 322, 324

(56) References Cited

U.S. PATENT DOCUMENTS

| | | | |
|---|---|---|---|
| 4,882,245 A | | 11/1989 | Gelmore et al. ............... 430/14 |
| 5,035,939 A | * | 7/1991 | Conlon et al. ............... 428/137 |
| 5,541,408 A | | 7/1996 | Sittler ........................ 250/288 |
| 6,001,428 A | * | 12/1999 | Finter et al. ................. 427/485 |
| 6,298,902 B1 | * | 10/2001 | DeSimone et al. .......... 164/131 |
| 6,558,475 B1 | * | 5/2003 | Jur et al. ....................... 134/21 |

OTHER PUBLICATIONS

DeSimone, JM et al., "*Synthesis of Fluoropolymers in Supercritical Carbon Dioxide*", p. 945–947. 1992.

\* cited by examiner

*Primary Examiner*—Mark F. Huff
*Assistant Examiner*—Nicole Barreca
(74) *Attorney, Agent, or Firm*—Douglas G. McKinley, Jr.

(57) ABSTRACT

A method of forming complex three-dimensional microstructures wherein an external stimulus is applied to a first layer of a photosensitive material, thereby creating voids in the first layer, and any material present in those voids is removed. A sacrificial material is then provided within at least a portion of the voids. This sacrificial layer fills the voids, either in whole or in part, and enables a second layer of photosensitive material to be stacked upon the first, while still preserving the pattern formed in the first layer. Once the sacrificial layer has been applied, a second layer of photosensitive material may then be stacked onto the first. Successive layers of photosensitive material and sacrificial material may be added until a final, complex three-dimensional structure is created. The sacrificial material may then be removed with a solvent such as carbon dioxide.

25 Claims, 1 Drawing Sheet

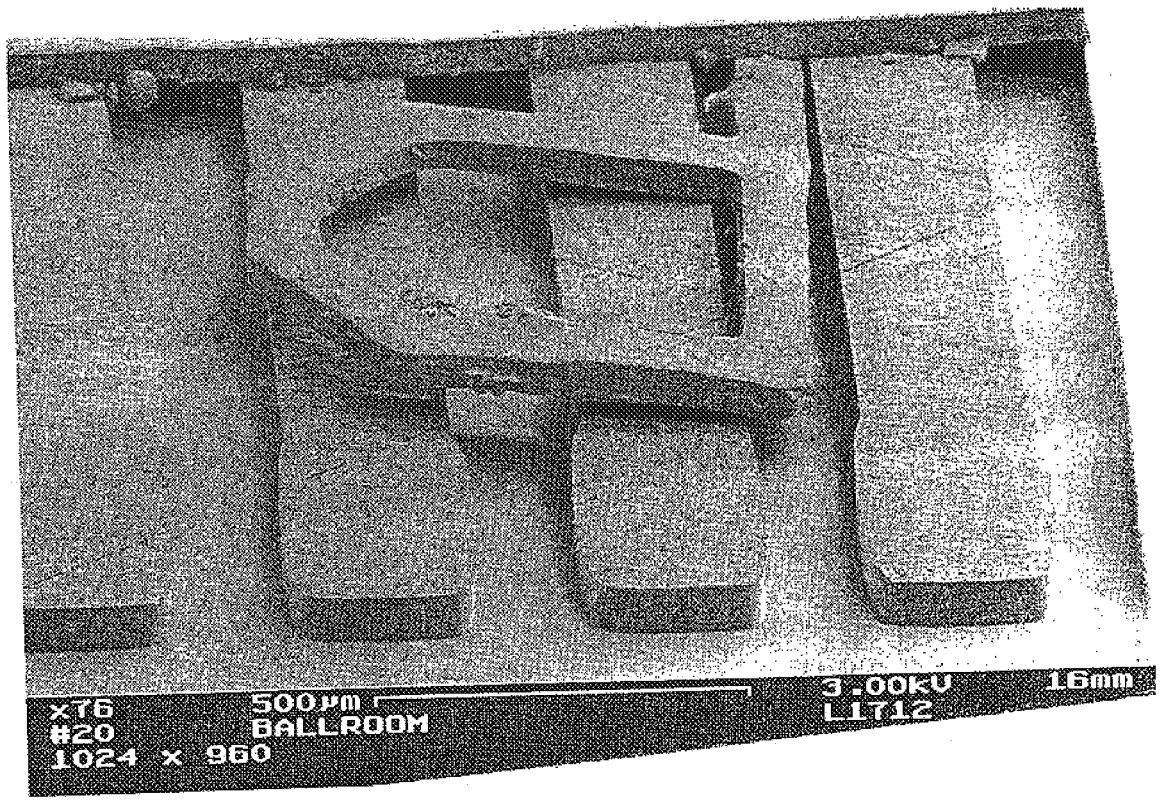

THREE DIMENSIONAL MICROSTRUCTURES AND METHOD OF MAKING

CROSS-REFERENCE TO RELATED APPLICATIONS

Not Applicable

BACKGROUND OF THE INVENTION

The techniques and materials used in the fabrication of integrated circuits and semiconductors have been applied to a variety of different problems where the very small scale inherent in the devices fabricated with these materials and techniques offer advantages to the end users. Despite the very small scale, the precision fabrication techniques that have enabled the fabrication of complex integrated circuits, such as modern microprocessors, have allowed other very intricate devices that are not integrated circuits to be designed and built using these techniques. One good example of the complexity possible in such devices is International Patent Application No. PCT/US94/10385, International Publication Number WO 95/12894 entitled "Micromachined Mass Spectrometer." This disclosure describes a micromachined mass spectrometer fabricated on a silicon substrate.

While complicated devices such as the micromachined mass spectrometer have been developed, there still exist drawbacks inherent in building such structures out of silicon materials. To over come these drawbacks, a number of new materials have been investigated for the development of microscale devices. Among these materials are photosensitive materials, which are materials that undergo a physical change upon exposure to energy, for example light or electrons. A good example of a photosensitive material is SU-8, manufactured by the Microchem Corp. of Newton, Mass. SU-8 is a negative, epoxy-type, near-UV photoresist based on EPON SU-8 epoxy resin (from Shell Chemical) that was originally developed, and patented by IBM (U.S. Pat. No. 4,882,245 (1989), the entire contents of which are incorporated herein by this reference). Upon exposure to near UV light, SU-8 cross-links and forms highly stable, polymerized bonds. This allows SU-8 to be formed into highly complex patterns, as a solvent can then be applied to the portion of the material that isn't cross-linked to remove it. Accordingly, by carefully controlling the exposure of the material to near UV light, complex patterns in a single layer of SU-8 are easily formed.

Single layers of SU-8 have been shown to be as thick as 2 mm and aspect ratios of greater than 20 have been demonstrated with standard contact lithography equipment. These results are generally attributed to the low optical absorption of the material in the UV range which only limits the thickness to 2 mm for the 365 nm-wavelength, where the photo-resist is the most sensitive (i.e., for this thickness 100% absorption occurs). These properties have naturally led to significant interest in SU-8 for use in microscale devices. For example, Sotec Microsystems, 11 avenue des Baumettes, 1020 RENENS, Switzerland, has sought to develop and commercially market microscale devices based almost exclusively on SU-8 as a material of construction.

Despite the significant energy that has been focused into using materials such as SU-8 as materials of construction for microscale devices, and the advantages inherent in the high aspect ratios enabled by photosensitive materials such as SU-8, the development of practical devices that fulfill needs in the marketplace built with these materials has not been overwhelming. One drawback that may have hindered the wide adaptation of devices fabricated with such materials is a failure on the part of designers to devise simple methods and techniques for readily using these materials in the fabrication of complex, three-dimensional structures, particularly methods and techniques that lend themselves to high levels of automation, and thus repeatable results. Thus, there exists a need for methods and techniques that allow the development of complex three-dimensional structures utilizing photosensitive materials.

BRIEF SUMMARY OF THE INVENTION

Accordingly, it is an object of the present invention to provide a microfabrication method for forming complex, three-dimensional structures.

It is a further object of the present invention to provide a microfabrication method for forming complex, three-dimensional structures that utilizes off the shelf, fully automated photolithography techniques.

It is a further object of the present invention to provide a microfabrication method for forming complex, three-dimensional structures that utilizes off the shelf photosensitive materials.

These and other objects of the present invention are accomplished by a method for fabricating three-dimensional structures. More particularly, the present invention is a method of fabricating three-dimensional structures that have micro-scale features. At the most basic level, the invention is carried out by first providing a first layer of a photosensitive material, applying an external stimulus to the layer, thereby creating voids in the first layer, and removing any material present in those voids.

As will be recognized by those having skill in the art, the creation of voids may be "positive" or "negative", depending upon the selection of a particular photosensitive material. For example, and not meant to be limiting, when using UV activated photoresists as a photosensitive material, the application of UV energy causes the hardening of an epoxy material. The surrounding material may then be removed. In contrast, and again not meant to be limiting, when using photosensitive materials and electron beams, it is more typical that the portion of the photosensitive materials which have been exposed to the electron beams have bonds broken, thereby forming voids of material which is readily removed. The present invention should therefore be broadly construed to encompass photosensitive materials that form both positive and negative voids.

As used herein, "external stimulus" refers to the application of either photons or electrons to the material to bring about a change within the material. Highly advanced techniques and methods in the fields of photolithography and electron beam physics have enabled skilled artisans to apply such external stimulus in very precise patterns, thereby allowing the creation of highly detailed and complex patterns within a single layer of a photosensitive material. While not meant to be limiting, in a preferred embodiment, the present invention utilizes those techniques in the creation of three-dimensional microstructures by forming successive layers of photosensitive materials, each patterned with these known techniques and methods.

While the techniques and methods of photolithography and electron beam physics may be utilized to create patterns within each layer of the photosensitive materials of the present invention, numerous patents and other publications have described them in great detail. Accordingly, skilled artisans have sufficient familiarity with these techniques and methods, and a detailed explanation of them is not necessary to furthering an understanding of the present invention.

After a first layer of a photosensitive material has been formed into a pattern, (by applying an external stimulus to create voids in the first layer and removing any material present in those voids), the present invention then provides a sacrificial material within at least a portion of the voids. This sacrificial layer fills the voids, either in whole or in part, and enables a second layer of photosensitive material to be stacked upon the first, while still preserving the pattern formed in the first layer. Absent the sacrificial layer, the second layer of photosensitive material would fill the voids of the first layer, and the pattern would be lost. Once the sacrificial layer has been applied, a second layer of photosensitive material may then be stacked onto the first.

The second layer is then patterned in the same manner as the first, by applying an external stimulus to create voids in the second layer and removing any material present in those voids. In this manner, successive layers of the photosensitive material can be individually patterned and stacked upon one and another, thereby allowing the creation of highly complex, three dimensional microstructures having virtually unlimited geometries. Voids are preserved, either in whole or in part, in each successive layer by the presence of the sacrificial material. Thus, an additional step of removing the sacrificial material after the addition of the second layer, or after the addition of a series of successive layers, allows the patterns formed in the layers to form into a complex, three dimensional, structures on a micro scale.

While the simplest example of the present invention is a three dimensional structure built of only two layers of photosensitive materials, the technique of the present invention that allow the creation of a two layer structure can be repeated for an infinite number of successive layers, thereby allowing the creation of highly complex three dimensional structures made of many layers stacked on top of one and another. This is accomplished simply by adding additional successive layers of photosensitive material, applying an external stimulus to each successive layer of photosensitive material, thereby creating voids in each additional layer, removing any material present in the voids, providing additional successive layers of sacrificial material within at least a portion of the voids and interspaced between each of the additional successive layers of photosensitive material, and removing the layers of sacrificial materials.

As used herein, "a photosensitive material" is any a material which undergoes a change in solubility to a solvent upon exposure to photons or electron beams. Accordingly, suitable photosensitive materials are any materials which, upon exposure to photons or electron beams, become either more or less soluble in a solvent, thereby allowing patterns to be formed in the photosensitive materials by such exposure and the subsequent removal of the soluble portion of the photosensitive materials with a suitable solvent. As will be apparent to those having skill in the art, the particular photosensitive material selected will typically dictate the desired solvent, and vendors of photosensitive materials typically sell photosensitive materials with suitable solvents designed for use with the particular photosensitive material.

While not meant to be limiting, preferred photosensitive materials for carrying out the present invention include, but are not limited to, UV activated photoresists, which typically include both a resin and a curing agent. Suitable resins include, but are not limited to bisphenol A glycidyl ether polymer (CAS 28906-96-9) (CAS 25068-38-6), p-tertbutylphenyl glycidyl ether (CAS 3101-60-8), polyester, urethane, or combinations thereof. Suitable curing agents include, but are not limited to mixed triarylsulfonium/hexafluoroantimonate salt (CAS 89452-37-9/CAS 71449-78-0), 2-Hydroxy-4'-hydroxyethoxy-2-methylpropiophenone (CAS 106797-53-9), phenylbis(2,4,6-trimethyl benzoyl) phosphine oxide (CAS 162881-26-7), 1-hydroxycyclohexyl phenyl ketone (CAS 947-19-3), Bis (2,6-dimethoxybenzoyl)-2,4,4 trimethylpentylphosphineoxide (CAS 145052-34-2), 2,4,6 trimethylbenzophenone (CAS 954-16-5), 4-methylbenzophenone (CAS 134-84-9), 2-methylbenzophenone (CAS 131-58-8 ), 2,2-diethoxyacetophenone (CAS 6175-45-7), and combinations thereof. As will be recognized by those having skill in the art, suitable resin/curing agent combinations are commercially available, and would include examples such as SU-8 (epoxy resin of bisphenol A glycidyl ether polymer) (CAS 28906-96-9), photoacid generator of mixed triarylsulfonium/hexafluoroantimonate salt (CAS 89452-37-9/CAS 71449-78-0), solvents propylene carbonate (CAS 108-32-7) and gammabutyrolactone (CAS 96-48-0) all available from MicroChem Corp. of Newton, Mass.

Again, while not meant to be limiting, suitable photosensitive materials further include electron beam activated resists, such as AZ5200—novolak type, ZEP7000 an acrylate and styrene copolymer (both available from Nippon Zeon Co. Ltd., Tokyo, Japan); polymethylmethacrylates such as 495PMMA and 950PMMA—(both available from MicroChem Corp. of Newton, Mass.); UV cured adhesives and potting agents, such as CT-523-LV (an epoxy: Bisphenol A diglycidyl ether polymer) (CAS 25068-38-6) and p-tertbutylphenyl glycidyl ether (CAS 3101-60-8) available from the Resin Technology Group, South Easton, Mass.); UV cured conformal coatings, such as 1A37HV and 1C61 (epoxies—HumiSeal Corp., Woodside, N.Y.); UV cured powder coatings, such as those based on resins such as Uracross P3898—a vinylether urethane resin, Uracross P3307—a vinylether urethane resin, and Uracross P3125—a polyester resin (DSM Resins, Zwolle, The Netherlands) and photoinitators, such as Irgacure 2959 (2-Hydroxy-4'-hydroxyethoxy-2-methylpropiophenone CAS 106797-53-9), Irgacure 819 (phosphine oxide, phenylbis(2,4,6-trimethyl benzoyl)-CAS 162881-26-7), Irgacure 184 (1-hydroxycyclohexyl phenyl ketone CAS 947-19-3), Irgacure 1800 (Bis(2,6-dimethoxybenzoyl)-2,4,4 trimethylpentylphosphineoxide, CAS 145052-34-2), Ciba Geigy), and Esacure TZT (2,4,6-trimethylbenzophenone CAS 954-16-5, 2-methylbenzophenone CAS 131-58-8 and 4-methylbenzophenone CAS 134-84-9, Sartomer Corp) and 2,2-diethoxyacetophenone (CAS 6175-45-7) and combinations thereof.

The method of the present invention thus allows the formation of complex structures having micrometer sized features by utilizing sacrificial materials that can be rendered highly soluble with the proper solvent. Absent this high solubility, portions of the sacrificial materials will not be removed from the void spaces, thereby destroying the precision of the structures formed by the present invention. Accordingly, and while not meant to be limiting, the sacrificial materials are preferably selected as materials soluble in liquid carbon dioxide; supercritical carbon dioxide; hydrofluoroethers, such as HFE-7100 (methyl nonafluoroisobutylether CAS 163702-08-7 and methyl nonfluorobutylether CAS 163702-07-6) and HFE-7200 (ethyl perfluoroisobutyl ether CAS 163702-06-5 and ethyl perfluorobutyl ether CAS 163702-05-4) available from 3M Corp, Minneapolis, Minn., fluorocarbons, such FC-75

(perfluorocarbons CAS 86508-42-1) available from 3M Corp, Minneapolis, Minn., and alkanes, such as hexane or other petroleum distillates. Preferred sacrificial materials thus include, but are not limited to, fluoropolymers, such as perfluoro N-octyl methacrylate and perflurocyclohexyl acrylate, hydrocarbon waxes (paraffins), fluorocarbon waxes, and combinations thereof.

The method of the present invention may be further extended through the use of "functional materials." As use herein, the term "functional materials" refers to any material that may be mixed with, or adhered to, the photosensitive materials, and thereby impart a desired property to the resultant structure. For example, and not meant to be limiting, by mixing a material that will hold an induced dipole, for example, iron, nickel, cobalt and combinations thereof, with the photosensitive materials, a structure may be fabricated that can then be magnetized. Additionally, permanent magnetic materials, including but not limited to ALNICO I-VIII, and rare earth magnets including but not limited to samarium, cobalt, neodymium-iron-boron, and combinations thereof, may be mixed with the photosensitive materials to form permanent magnets. Other examples of functional materials include, but are not limited to, strength enhancing additives such as glass and/or carbon fibers, or dopants designed to alter the physical properties of the photosensitive materials, including, without limitation, the thermal, optical, acoustic, or elastic modulus. "Functional materials" can also include materials adhered to the surface of microdevices constructed by the method of the present invention. For example, organic molecules having high affinity for selected bio-molecules and the like can be adhered to the surfaces of micro devices fabricated according to the method of the present invention, thereby imparting specific surface chemistries to such devices, or certain surfaces of such devices.

The sacrificial materials used in the present invention can also be interposed between the layers of the photosensitive materials and a substrate upon which the structures are fabricated. In this manner, when the sacrificial materials are removed, the bond holding the structure to the substrate is also removed, thereby allowing micro structures to be fabricated as free standing micro structures.

The inherent flexibility of the method of the present invention, together with the use of functional materials, allows the fabrication of an enormous breadth and depth of different types of micro structures. Essentially any structure that exists on a macro scale may be fabricated on a micro scale using the method of the present invention. While not meant to be limiting, exemplary structures whose utility on a micro scale is readily apparent, and which can be fabricated on a micro scale according to the method of the present invention, thus include, but are not limited to, biologically implantable biologically active microstructures, adjuvants for optical property control e.g., UV absorption, heat exchangers, wave guides, splitters, coupling, evanescent junctions, fiberoptic couplers, bandgap structures (microwave, photonic), fiber optic sockets and connectors, heat pipes for circuit cooling, microfluidics systems based on pneumatic pumping: using electromagnets and permanent magnets for motors and valves, blood cell sorters, DNA analyzers; microfluidics applications such as channels, pumps, reservoirs, and valves; micro-stereo lithography, integration of conventional microcircuits (die form) and "micro machines" microscale DC motors and pumps, microscale valves; for example, activated by electro magnet, resonator structures (optics, magnetics, acoustics, electronic); oxygen and fuel cell monolithic ceramic structures "glued" using photosensitive materials as an adhesive at seams; micro robots, filters, switches crossbar (mechanical, electrical, optical, flow); heat exchangers; separations filters and valves.

BRIEF DESCRIPTION OF THE DRAWING

FIG. 1 is an electron micrograph of a structure created to demonstrate of a preferred embodiment of the present invention.

DETAILED DESCRIPTION OF THE INVENTION

A series of experiments were conducted to demonstrate the principles of the present invention. These experiments demonstrated the fabrication of free-standing micro components and fabrication of closed tunnels or conduits of essentially unlimited length/cross-sectional area ratio. The structures resulting from these experiments are shown the two electron micrographs, FIG. 1. A letter "P" was fabricated on a release layer, then captured with micro tools and moved so that its foot penetrated a conduit. The conduit is 150 microns wide, 50 microns tall, and 10,000 microns long.

The photolithographic processing of these devices was carried out using a commercially available photosensitive material and solvent system, specifically SU8-50C from Microchem Corporation of Newton, Mass. The "50" denotes viscosity, which ranges from 5 to 500 in Microchem's arbitrary labeling. The "C" represents an alternative solvent chosen for lower toxicity but which is also less polar than the standard solvent provided by the company.

Typical substrates were 50 millimeter diameter recycled silicon wafers about 0.014" thick, one side polished, with occasional minor scratches as a consequence of the recycling. Doping varies and was considered unimportant to this process. The wafers were prepared by wiping with methanol, rinsing with deionized water, etching briefly in buffered hydrofluoric acid, rinsing with deionized water, blowing dry with nitrogen, and baking on a hotplate at 250° C. for 30 minutes.

The wafer was placed on a spinner after removal from the hotplate and brief cooling. Bubble-free SU8-50C was dispensed from an autopipette onto the center of the stationary wafer (2.5 mL for a 50 mm wafer). Spinning with high acceleration to 2000 rpm was started as soon as possible after the dispense and continued for 90 seconds. The film was dried before patterning by a gentle hotplate bake starting at 35° C. and ramping to 65° C. at 1° C. per minute, then cooled back to 35° C. at 2° C. per minute. Faster thermal ramps cause cracking of the film.

Patterning was accomplished by selectively exposing the SU8 coated wafer with ultraviolet light through a mask. SU8 is a negative photosensitive material, meaning the material exposed to UV cross-links making it insoluble. A glass mask coated with an opaque iron oxide film in the negative image was placed over the SU8 coated wafer in a contact mask aligner, and exposed to UV from a high pressure mercury vapor lamp for about 100 seconds.

After exposure a higher temperature bake was required to facilitate the cross-linking. This post exposure bake was conducted on a hotplate ramped from 40° C. to 100° C. and back to 60° C., all at 1° C. per minute. Developing (i.e. dissolving the unreacted SU8) occurred in fall strength SU8 developer from Microchem in three successive baths. The first was magnetically stirred and the wafer was soaked with stirring for 6 minutes. The next two baths, with clean developer, were not stirred and the wafer soaked one minute in each. After withdrawal from the third bath the wafer was blown dry with nitrogen.

The next step was powder coating the wafers with a sacrificial material. For these experiments, a fluoropolymer powder was selected as the sacrificial material. The preparation of the fluoropolymer is described in greater detail at the conclusion of this description of the experiments. The apparatus used to apply the sacrificial material was a model C-30 powder coater (Electrostatic Technologies, Inc. of Branford, Conn.). Nitrogen was used to fluidize the bed, and the electrostatic potential was set at 50 kV. The back side of each wafer was covered with static dissipative tape to keep powder off of the back of the wafer. The wafer was held using vacuum applied through a small suction cup (as is used for positioning integrated circuits). A copper tube and a wire provided a path to electrical ground as the wafer was coated.

Held thusly, each wafer was passed through the powder cloud about one inch above the bed. Residence time in the powder cloud was about three seconds. The tape was removed from the wafer, and the wafer was placed in a cold oven. The oven was then ramped to 100° C. over about ten minutes, and the wafers were held at this temperature overnight. The oven was turned off the next morning and allowed to cool for about one hour. This treatment left a smooth film of fluoropolymer on the wafer that completely filled and encapsulated the SU-8 microstructure.

Planarization of the fluoropolymer to the level of the SU8 required polishing on fine sandpaper. Suitable conditions were 600 grit paper on an Ecomet 4 Variable Speed Polisher, 200 rpm wet, counter-rotating platen, and two pounds force per wafer. Wafers were attached to the polishing platen with Crystolite, which melts at about 100° C. and is acetone soluble. The duration of the polishing was about five minutes.

After planarization the wafers were removed from the platen, washed in acetone and deionized water, blown dry, and remounted on the spinner. Dispensing, spinning, baking, exposing, and developing the SU8-50C was performed the same as above to create the second layer. The low polarity solvent of the "C" formulation was important at this point because a uniform coating on the fluoropolymer was needed. Powder coating and polishing may also be repeated as above, allowing a multilayer monolithic complex structure.

The sacrificial fluoropolymer was removed from the wafer by extraction with supercritical carbon dioxide modified with ten percent HFE-7100 (3M Corp. Minneapolis, Minn.). Wafers were placed one or two at a time in a one liter autoclave (Autoclave Engineers) equipped with a Magnedrive II™ stirring unit having a two inch diameter, four-bladed impeller. The Magnedrive was cooled with water at 10° C. (ca. ½ gal/min) and air cooled with a fan. Wafers were suspended in the autoclave using custom made mounts. 100 mL of HFE-7100 was added to the autoclave. The autoclave was then sealed and pressurized with about 500 g of carbon dioxide. The autoclave was heated to 75° C., pressurized with carbon dioxide to about 3,500 psi, and stirred at about 900 rpm for ten hours. During this time about 500 g of carbon dioxide was slowly flowed through the autoclave (ca 0.2 mL/min).

Heating was discontinued and the autoclave was allowed to cool to ambient temperature. At this point carbon dioxide in the autoclave was a liquid, and about 600 mL of liquid carbon dioxide was drained from autoclave bottom connection. The autoclave was then heated to 75° C. and pressurized with carbon dioxide to about 3,500 psi. The pressure was slowly vented overnight with the temperature maintained at 75° C. Heating was discontinued once the autoclave was depressurized, and the autoclave was opened after it cooled to ambient temperature. The samples were removed and examined with optical and electron microscopy.

The polymer poly (perfluoro-n-octyl methacrylate) was prepared from the monomer perfluoro-n-octyl methacrylate via a free radical initiation reaction in carbon dioxide solvent. The synthesis proper is similar to that reported by De Simone et al.in "Synthesis of Fluoropolymers in Supercritical Carbon Dioxide", J. M. De Simone, Zihibin Guan, C. S. Elsbernd Science, 257 945-947 (1992), the entire contents of which are incorporated herein by this reference. 400 g of the monomer along with 4 g of AIBN was added to a one liter autoclave (Autoclave Engineers) equipped with a Magnedrive stirrer. The AIBN was recrystalized twice from methanol immediately prior to the reaction. The autoclave was sealed and purged three times with carbon dioxide at about 300 psi to remove atmospheric oxygen. The autoclave was heated to 60° C., pressurized with carbon dioxide to about 3,000 psi and stirred for three days. The pressure was maintained with a syringe pump.

Residual initiator was extracted from the reaction mixture after cooling to room temperature. The contents of the autoclave were split into a gaseous headspace over a solution of polymer in liquid carbon dioxide. The residual initiator was extracted using a mixture of methanol/water (50/50). The methanol/water was added, the autoclave was vigorously stirred, then allowed to stand. The methanol/water separated as a layer above the liquid carbon dioxide-polymer solution. The methanol/water was drawn off through a connection at the top of the vessel. This sequence of "add, stir, settle, remove" was repeated three times with the water content increasing with each repetition such that the last cycle utilized pure water. The polymer was then collected through the bottom connection of the one liter autoclave in a stepwise fashion. Ten mL of liquid at a time was discharged into a 300 mL autoclave where the polymer precipitated and the carbon dioxide vapor was allowed to escape.

The collected fluoropolymer was ground to a powder having a particle size between 45 and 105 microns. Films of the fluoropolymer were cast by melt fusing on non-stick pie pans in an oven at 100° C. Films were broken into flakes and coarse ground with a mortar and pestle using dry ice to ensure crystalinity of the fluoropolymer during grinding. Fine grinding was done with coffee grinders which were pre-chilled with dry ice. Ground fluoropolymer was sieved with precision sieves (Humbolt Scientific) until it passed through a 105 micron sieve. Sufficient fluoropolymer powder was prepared in this manner to load the powder coater (about one-half pound).

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for fabricating three dimensional structures comprising the steps of
   a. providing a first layer of a photosensitive material of epoxy resin of bisphenol A glycidyl ether polymer)

(CAS 28906-96-9) and a photoacid generator of mixed triarylsulfonium/hexafluoroantimonate salt (CAS 89452-37-9/CAS 71449-78-0), b. applying an external stimulus of UV light to said first layer, thereby creating voids in said first layer, c. removing any material present in said voids, d. providing a layer of a sacrificial material of a fluropolymer within at least a portion of said voids, e. providing a second layer of photosensitive material of epoxy resin of bisphenol A glycidyl ether polymer) (CAS 28906-96-9) and a photoacid generator of mixed triarylsulfonium/hexafluoroantimonate salt (CAS 89452-37-9/CAS 71449-78-0) on top of said layer of a sacrificial material and in contact with at least a portion of said first layer;

f. applying an external stimulus of UV light to said second layer, thereby bonding said first to said second layer, and g. removing said sacrificial layer by dissolving said sacrificial layer in carbon dioxide.

2. A method for fabricating three dimensional structures comprising the steps of a. providing a first layer of a photosensitive material, b. applying an external stimulus in said first layer, thereby creating voids in said first layer, c. removing any material present in said voids, providing a layer of a sacrificial material within at least a portion of said voids, e. providing a second layer of photosensitive material on top of said layer of a sacrificial material and in contact with at least a portion of said first layer, and f. applying an external stimulus in said second layer, thereby bonding said second layer to said first layer.

3. The method of claim 2 further comprising the additional steps of a. adding additional successive layers of photosensitive material, each of said successive layers in contact with at least a portion of a previously added layer of photosensitive material, b. applying an external stimulus to at least one of said successives layers of photosensitive material, thereby creating voids in said layers of photosensitive material and bonding said successive layers with at least a portion of a previously added layer, c. removing any material present in said voids, d. providing additional successive layers of sacrificial material within at least a portion of said voids prior to applying an external stimulus to each of said successive layers of photosensitive material, and e. removing the layers of sacrificial materials.

4. The method of claim 3 further comprising the additional step of removing each layer of a sacrificial material subsequent to the addition of each of said successive layers of photosensitive materials.

5. The method of claim 2 wherein said photosensitive material is provided as selected from the group consisting of UV activated photoresists, electron beam activated resists, polymethylmethacrylates, UV cured adhesives and potting agents, UV cured conformal coatings, UV cured powder coatings, and combinations thereof.

6. The method of claim 5 where said electron beam material is selected from the group consisting of novolak type, an acrylate and styrene copolymer, a polymethylmethacrylate, or combinations thereof.

7. The method of claim 5 wherein said UV cured adhesives and potting agents are selected from the group consisting of bisphenol A diglycidyl ether polymer) (CAS 25068-38-6), p-tertbutylphenyl glycidyl ether (CAS 3101-60-8) and combinations thereof.

8. The method of claim 5 wherein said UV cured powder coatings are selected from the group consisting of vinylether urethane resins, polyester resins, and combinations thereof.

9. The method of claim 2 wherein said photosensitive material is comprised of a resin and a curing agent.

10. The method of claim 9 where said resin is an epoxy.

11. The method of claim 10 where said epoxy is selected from the group consisting of bisphenol A glycidyl ether polymer (CAS 28906-96-9) (CAS 25068-38-6), p-tertbutylphenyl glycidyl ether (CAS 3101-60-8), a polyester, a urethane or combinations thereof.

12. The method of claim 9 where said curing agent is selected from the group consisting of mixed triarylsulfonium/hexafluoroantimonate salt (CAS 89452-37-9/CAS 71449-78-0), 2-Hydroxy-4'-hydroxyethoxy-2-methylpropiophenone (CAS 106797-53-9), phenylbis(2,4,6-trimethyl benzoyl) phosphine oxide (CAS 16288 1-26-7), 1-hydroxycyclohexyl phenyl ketone (CAS 947-19-3), Bis (2,6-dimethoxybenzoyl)-2,4,4 trimethylpentylphosphineoxide (CAS 145052-34-2), 2,4,6 trimethylb enzophenone (CAS 954-16-5), 4-methylbenzophenone (CAS 134-84-9), 2-methylbenzophenone (CAS 131-58-8), 2,2-diethoxyacetophenone (CAS 6175-45-7), and combinations thereof.

13. The method of claim 2 where said sacrificial material is soluble in liquid carbon dioxide.

14. The method of claim 2 where said sacrificial material is soluble in super critical carbon dioxide.

15. The method of claim 2 where said sacrificial material is soluble in a mixture of liquid carbon dioxide and a cosolvent selected from the group consisting of hydrofluoroethers, fluorocarbons, alkanes, other petroleum distillates, and combinations thereof.

16. The method of claim 2 where said sacrificial material is soluble in a mixture of super critical carbon dioxide and a cosolvent selected from the group consisting of hydrofluoroethers, fluorocarbons, alkanes, other petroleum distillates, and combinations thereof.

17. The method of claim 2 where said sacrificial material is removed by dissolving said sacrificial material in a solvent selected from the group consisting of liquid carbon dioxide, supercritical carbon dioxide, hydrofluoroethers, fluorocarbons, alkanes, other petroleum distillates, and combinations thereof.

18. The method of claim 17 wherein said hydrofluoroethers are selected from the group consisting of methyl nonafluoroisobutylether CAS 163702-08-7, methyl nonfluorobutylether CAS 163702-07-6, ethyl perfluoroisobutyl ether CAS 163702-06-5, ethyl perfluorobutyl ether CAS 163702-05-4, and combinations thereof.

19. The method of claim 17 wherein said fluorocarbons are selected as perfluorocarbons CAS 86508-42-1.

20. The method of claim 17 wherein said alkanes are selected from the group consisting of hexane or other petroleum distillates.

21. The method of claim 2 wherein said sacrificial materials are selected from the group consisting of fluoropolymers, hydrocarbon waxes, fluorocarbon waxes, and combinations thereof.

22. The method of claim 21 wherein said fluoropolymers are selected from the group consisting of poly(perfluoro N-octyl methacrylate) and poly(perflurocyclohexyl acrylate), and combinations thereof.

23. The method of claim 2 wherein said photosensitive material is provided as containing a functional material.

24. The method of claim 2 wherein said first layer of photosensitive material is provided on a layer of sacrificial material on a substrate.

25. The method of claim 24 further comprising the step of dissolving said sacrificial material, thereby releasing the resultant three dimensional structure from said substrate.

* * * * *